United States Patent
Broughton et al.

(10) Patent No.: US 11,159,135 B2
(45) Date of Patent: Oct. 26, 2021

(54) LOWER-SKEW RECEIVER CIRCUIT WITH RF IMMUNITY FOR CONTROLLER AREA NETWORK (CAN)

(71) Applicant: TEXAS INSTRUMENTS INCORPORATED, Dallas, TX (US)

(72) Inventors: Richard Sterling Broughton, Dallas, TX (US); Vijayalakshmi Devarajan, Plano, TX (US); Richard Edwin Hubbard, Lavon, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/862,089

(22) Filed: Apr. 29, 2020

(65) Prior Publication Data
US 2020/0350879 A1 Nov. 5, 2020

Related U.S. Application Data

(60) Provisional application No. 62/840,600, filed on Apr. 30, 2019.

(51) Int. Cl.
H03F 3/45 (2006.01)
H04L 12/40 (2006.01)

(52) U.S. Cl.
CPC ......... *H03F 3/45192* (2013.01); *H04L 12/40* (2013.01); *H03F 2200/78* (2013.01); *H03F 2203/30061* (2013.01); *H03F 2203/45508* (2013.01); *H04L 2012/40215* (2013.01)

(58) Field of Classification Search
CPC ............................. H03F 3/4519; H04L 12/40
See application file for complete search history.

(56) References Cited

U.S. PATENT DOCUMENTS

| | | | | |
|---|---|---|---|---|
| 5,113,148 A | * | 5/1992 | Theus | H03F 3/3001 330/253 |
| 6,144,234 A | * | 11/2000 | Nakamura | G11C 27/026 327/92 |
| 6,208,208 B1 | * | 3/2001 | Komatsu | H03F 3/3028 330/255 |
| 10,840,861 B1 | * | 11/2020 | Al-Shyoukh | H03F 3/195 |
| 2007/0046378 A1 | * | 3/2007 | Baum | H03F 3/45309 330/311 |
| 2013/0088473 A1 | * | 4/2013 | Tsuchi | H03F 3/45076 345/211 |
| 2013/0106512 A1 | * | 5/2013 | Cheng | H03F 3/45192 330/253 |
| 2015/0256138 A1 | * | 9/2015 | Dasgupta | H03F 3/3023 330/255 |

* cited by examiner

*Primary Examiner* — Patricia T Nguyen
(74) *Attorney, Agent, or Firm* — John R. Pessetto; Charles A. Brill; Frank D. Cimino

(57) ABSTRACT

A circuit (e.g., implemented as part of a controller area network (CAN) bus receiver includes a pre-amplifier stage having first and second outputs. The circuit also includes a comparator having first and second inputs. The first input is coupled to the first output of the pre-amplifier stage, and the second input is coupled to the second output of the pre-amplifier stage. The comparator includes an input differential transistor pair, a second pair of transistors coupled to the input differential transistor pair in a cascode configuration, and a push-pull output stage coupled to the second pair of transistors.

11 Claims, 2 Drawing Sheets

LOWER-SKEW RECEIVER CIRCUIT WITH RF IMMUNITY FOR CONTROLLER AREA NETWORK (CAN)

CROSS-REFERENCE TO RELATED APPLICATIONS

This application claims priority to U.S. Provisional Application No. 62/840,600, filed Apr. 30, 2019, which is hereby incorporated by reference.

BACKGROUND

The controller area network (CAN) is a bus standard designed to allow microcontrollers and devices to communicate with one another in applications without a host computer. The CAN BUS protocol is a message-based protocol, particularly suitable for multiplexed electrical wiring within automobiles to save copper but is also used in other contexts.

SUMMARY

In one example, a circuit (e.g., implemented as part of a controller area network (CAN) bus receiver includes a pre-amplifier stage having first and second outputs. The circuit also includes a comparator having first and second inputs. The first input is coupled to the first output of the pre-amplifier stage, and the second input is coupled to the second output of the pre-amplifier stage. The comparator includes an input differential transistor pair, a second pair of transistors coupled to the input differential transistor pair in a cascode configuration, and a push-pull output stage coupled to the second pair of transistors.

BRIEF DESCRIPTION OF THE DRAWINGS

For a detailed description of various examples, reference will now be made to the accompanying drawings in which.

DETAILED DESCRIPTION

A CAN bus transceiver is capable of both transmitting and receiving data and thus includes both a transmitter and a receiver. This disclosure pertains to the receiver of a CAN bus transceiver. Faster CAN bus receivers with smaller duty cycle distortion (i.e., the skew of dominant to recessive edges and recessive to dominant edges) are desirable and may be imposed by newer CAN bus specifications. However, faster receivers within CAN bus transceivers should still comply with large radio frequency (RF) immunity requirements to pass, for example, Direct Power Injection (DPI) testing.

Some CAN receivers include multiple stages between the CAN bus itself (CANH and CANL) and a comparator which compares signals indicative of CANH and CANL to drive a digital receive data line (RxD). In one example, the receiver includes two bipolar junction transistor-based pre-amplification stages with a bipolar junction transistor-based voltage level shifter between the pre-amplification stages. While such multiple pre-amplification and level shifting stages reduce the resolution requirements on the subsequent comparator stage, each stage has its own propagation delay thereby causing such receivers to have substantial overall delay with substantial signal skew. The CAN bus receiver described below addresses these issues.

Figure 1:
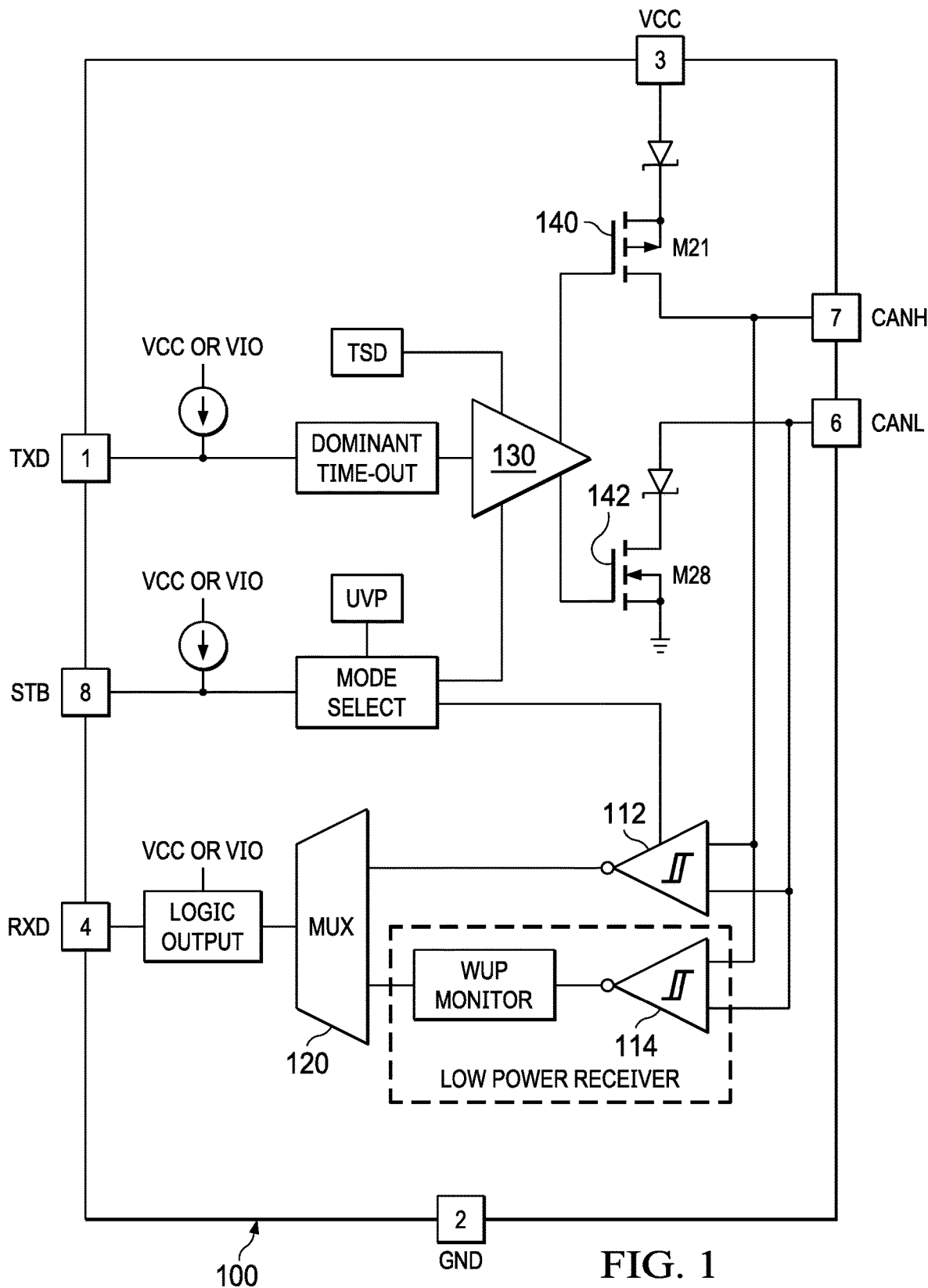
FIG. 1 illustrates an integrated circuit including a bus interface with a bus comparator.

FIG. 1 shows an example of a CAN bus transceiver integrated circuit (IC) 100. The CANH and CANL terminals are shown on the righthand side of the figure. The receiver portion of the transceiver includes one or more CAN bus comparators 112 and 114. Each comparator 112, 114 has inputs coupled to CANH and CANL and generates an output signal indicative of whether the voltage of CANH is larger or smaller than the voltage of CANL. Comparator 114 may have lower bias currents and be used in a low power mode. Multiplexer 120 is used to provide one or the other comparator output as the RxD output signal from the IC 100. In the comparator example of FIG. 2, the immediate output signal of the CAN bus comparator is labeled "RxD" for simplicity. The transmitter of the CAN bus receiver includes a pre-driver 130, high side transistor 140, and low side transistor 142. Digital data provided on the transmit input (TxD) is used to drive CANH and CANL via the pre-driver 130 and high and low side transistors 140, 142.

Figure 2:
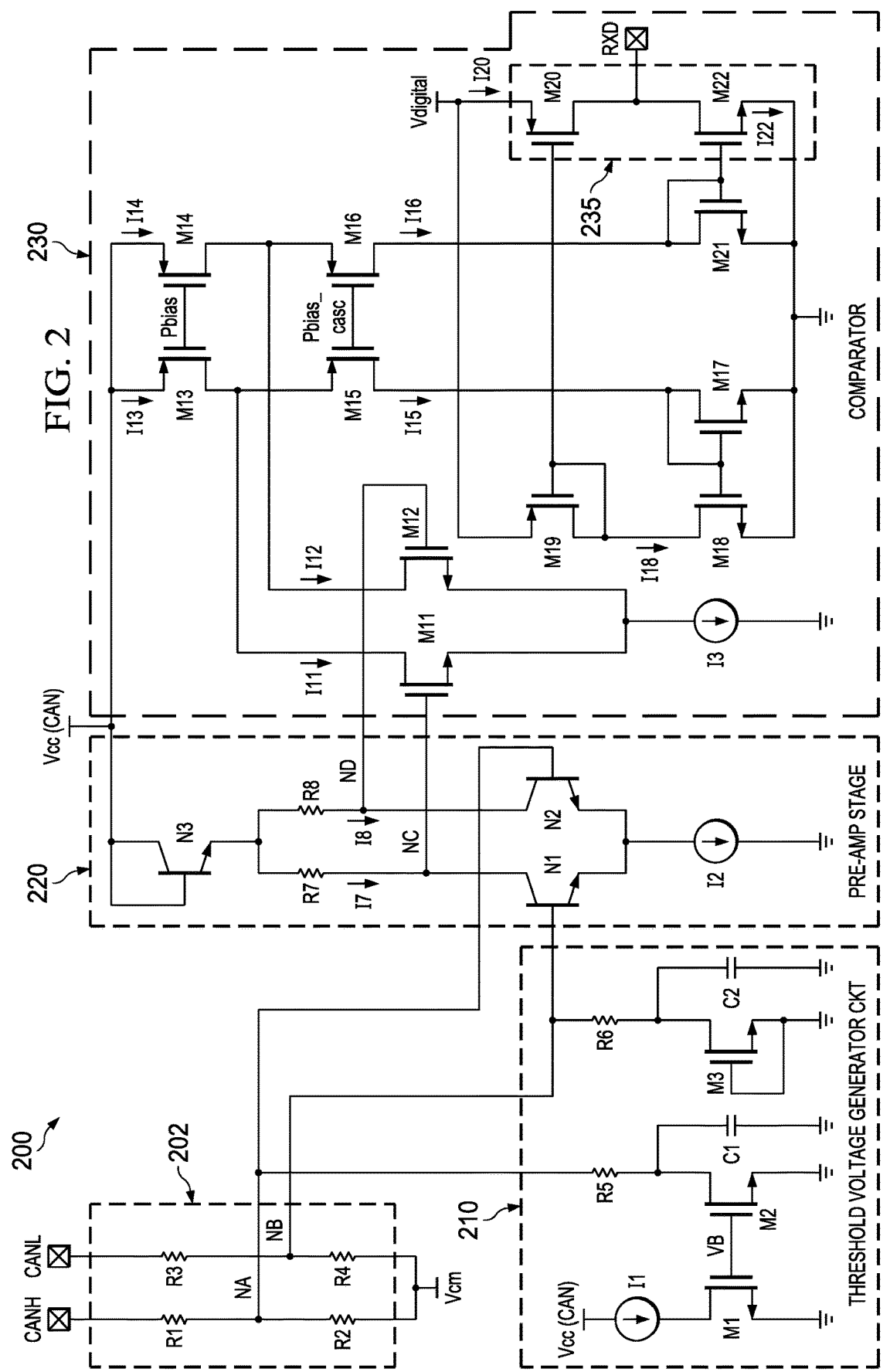
FIG. 2 illustrates an example circuit implementation of the bus comparator of FIG. 1.

FIG. 2 shows an example implementation of a CAN bus comparator 200, which can be used, for example, to implement either or both of CAN bus comparators 112, 114 of FIG. 1. In this example, the CAN bus comparator 200 includes a voltage divider 202, a threshold voltage generation circuit 210, a pre-amplification (pre-amp) stage 220, and a comparator 230. That is, "comparator" 230 within the circuit of FIG. 2 performs the comparison function of the CAN bus comparator 200.

The voltage divider 202 includes resistors R1-R4. R1 and R2 are coupled in series between CANH and a common mode voltage (Vcm). Node NA is the node between R1 and R2 and comprises a voltage at a level between CANH and Vcm. If R1 and R2 have the same resistance, then the voltage on NA is one-half the difference between CANH and Vcm. Similarly, R3 and R4 are coupled in series between CANL and Vcm. Node NB is the node between R3 and R4 and comprises a voltage at a level between CANL and Vcm. If R3 and R4 have the same resistance, then the voltage on NB is one-half the difference between CANL and Vcm. The voltage divider 202 divides down the voltages of CANH and CANL to a suitable level for the comparator 230.

Threshold voltage generation circuit 210 includes a current source device I1, resistors R5 and R6, capacitors C1 and C2, and transistors M1, M2, and M3. Transistors M1-M3 comprise n-type metal oxide semiconductor field effect transistors (n-type MOSFETS or "NMOS") in this example but can be implemented as other types of transistors in other example implementations. Current source device I1 is coupled to the drain of M1. The gates of M1 and M2 are coupled together and to a bias voltage VB. The sources of M1-M3 are coupled to ground. R5 and C1 are coupled in series between node NA and ground. The connection between R5 and C1 is also coupled to the drain of M2. Similarly, R6 and C2 are coupled in series between node NB and ground. The connection between R6 and C2 is also coupled to the drain of M3. The gate and source of M3 are coupled together.

Current I1 (I1 refers to both the current source device and the magnitude of the current it produces) flows through M1. M1 and M2 are coupled together to form a current mirror and thus I1 also flows through M2. Assuming a 1:1 current mirror ratio (the ratio can be other than 1:1), current I1 also flows through R1 thereby generating a voltage difference across R1. The inclusion of capacitors C1 and C2 result in low-pass filters comprising R5 and C1 and comprising R6 and C2. The voltage drop across R1 produces a change in voltage at the pre-amp stage 220 input on one side (by changing voltage drop across R1 that does not also happen across R3) which creates a shift in voltage threshold of V(CANH)−V(CANL) for which the circuit changes state. The CAN receiver zero cross point should be, per the CAN standard, V(CANH)−V(CANL)=0.7 V. R5 and R6 help to implement a low pass filter to protect the drain-to-source voltage (Vds) of the current mirror from high frequency voltage noise to improve radio frequency (RF) immunity (as the current from the current mirror directly sets the effective voltage threshold of the circuit).

Pre-amp stage 220 includes transistors N1-N3, resistors R7 and R8, and current source device I2 ("I2" refers both to the current source device itself and the magnitude of the current it produces). Transistors N1-N3 in this example comprise NPN bipolar junction transistors but can comprise other transistor types in other examples. N1 and N2 comprise an input differential pair of transistors. The emitters of N1 and N2 are coupled together and to current source device I2, which in turn is coupled to the ground node. The combined collector current of N1 and N2 thus comprises I2. The base and collector of N3 are coupled together and to supply voltage node, Vcc (CAN). R7 is coupled between the emitter of N3 and the collector of N1. Similarly, R8 is coupled between the emitter of N3 and the collector N2. The connection between R7 and the collector of N1 is node NC and the connection between R8 and the collector of N2 is node ND.

The bases of N1 and N2 are coupled to nodes NB and NA, respectively. When the CANL voltage is larger than the CANH voltage, the voltage on node NB will be larger than the voltage on node NA, and the base-to-emitter voltage (Vbe) of N1 will be larger than the Vbe of N2. As a result, a larger portion of I2 flows through N1 than N2. With the drain current of N1 being larger than the drain current of N2, more current will flow through R7 than through R8 and thus the voltage on node NC will be smaller than the voltage on node ND. Similarly, when the CANH voltage is larger than the CANL voltage, the voltage on node NA will be larger than the voltage on node NB, and the Vbe of N2 will be larger than the Vbe of N1. As a result, a larger portion of I2 flows through N2 than N1. With the drain current of N2 being larger than the drain current of N1, more current will flow through R8 than through R7 and thus the voltage node ND will be smaller than the voltage node NC. The voltages of NC and ND thus represent a scaled version of the voltages of CANH and CANL and comprise the input signals to be compared by comparator 230.

Comparator 230 includes transistors M11-M22 and current source device I3 ("I3" referring both to the current source device and the magnitude of the current it produces). M11, M12, M17, M18, M21, and M22 comprise p-type metal oxide semiconductor field effect transmits (PMOS) and M13-M16, M19, and M20 comprise NMOS transistors, although M11-M22 can be implemented as different types of transistors as desired. The sources of M11 and M12 are coupled together and to current source device I3. The gate of M11 is coupled to node NC and the gate of M12 is coupled to node ND. The drain of M11 is coupled to the drains of M13 and M15. The drain of M12 is coupled to the drains of M14 and M16. The gates of M13 and M14 are coupled together and to a bias voltage Pbias which biases M13 and M14 to operate in the saturation region. The drain current through M13 is I13 and the drain current through M14 is I14. With the sources of M13 and M14 coupled together, as well as their gates, M13 and M14 form a current mirror (having, for example, a 1:1 current mirror ratio) and thus I13 equals I14. The gates of M15 and M16 are coupled together and to a bias voltage node, Pbias_casc (which may be a different voltage than Pbias), which biases M15 and M16 to operate in the saturation region. I15 represents the drain current through M15. I16 represents the drain current through M16.

The gates of M17 and M18 are coupled together and to the drain of M17. The sources of M17 and M18 are coupled together and to ground. The drains of M15 and M17 are coupled together. M17 and M18 comprise a current mirror, which may have a 1:1 current mirror ratio, in which the current I15 through M17 is mirrored as current I18 through M18. Similarly, the gates of M21 and M22 are coupled together and to the drain of M21. The sources of M21 and M22 are coupled together and to ground. The drains of M16 and M21 are coupled together and to the gates of M21 and M22. M21 and M22 comprise a current mirror, which may have a 1:1 current mirror ratio, in which the current I16 through M21 is mirrored as current I22 through M22. The drains of M18 and M19 are coupled together and to the gate of M19. The sources of M19 and M20 are coupled together and to a supply voltage node, Vdigital, which may be a different supply voltage than Vcc (CAN). The drains of M20 and M22 are coupled together.

If the voltage of node ND is larger than the voltage of node NC, the gate-to-source voltage (Vgs) of M11 will be smaller than the Vgs of M12. As such, M12's drain current (I12) will be larger than M11's drain current (I11). With M13 biased in the saturation region with a fixed gate bias voltage (Pbias) and M13 and M14 forming a current mirror, I13 and I14 are equal to each other and are relatively constant. If I12 increases and I11 decreases (due M12 driven stronger and M11 driven weaker), then I16 through M16 will decrease and I15 through M15 will increase. Due to the current mirrors formed by M17 and M18 and by M21 and M22, I18 will equal I15 and I22 will equal I16. With I15 increasing and I16 decreasing as a result of ND being larger than NC, I18 will increase and I22 will decrease. M19 and M20 also form a current mirror and thus the drain current through M20 (I20) will be equal to I18 (assuming a 1:1 current mirror ratio). If I18 increases, then I20 also increases. If the voltage of node ND is larger than the voltage of node NC, I20 will be larger than I22, which results in RxD being high.

If the voltage of node NC is larger than the voltage of node ND, the Vgs of M11 will be larger than the Vgs of M12. As such, I11 will be larger than I12. If I11 increases and I12 decreases (due M11 driven stronger and M12 driven weaker), then I15 through M15 will decrease and I16 through M16 will increase. With I15 being smaller than I16 as a result of NC being larger than ND and due to the current mirrors of M17/M18 and M21/M22, I18 will be smaller than I22. Due to the current mirror of M19/M20, I20 will be smaller than I22 thereby resulting in RxD being low.

The output signal RxD is either at the ground potential or at the level of Vdigital depending on the voltage magnitude of NC relative to ND. As such, the use of Vdigital as the supply voltage for the output stage formed by M20 and M21 effectively level-shifts the voltages of CANH/CANL and NC/ND to the power domain of a downstream digital circuit to receive RxD.

CAN bus comparator 200 advantageously combines a folded cascode input implemented in part by M15/M16 with a push-pull clamped comparator output 235 formed by M20 and M22. The pre-amp stage 220 is coupled directly to the comparator 230 in the example of FIG. 2 without the use of a voltage level shifting stage as is otherwise the case of some other CAN bus comparators. Comparator 230 thus has improved input common mode range and power supply rejection similar to a conventional folded cascode amplifier. Further, the use of a different supply voltage (Vdigital) for the comparator's push-pull output stage 235 than the supply voltage Vcc CAN negates the need for an additional level shifting stage which otherwise can be a source of timing skew and bit width distortion. The slew rate (i.e., change in voltage with respect to time due to a change in changes in CANH and CANL voltages) may be higher with the architecture of FIG. 2 than with conventional CAN bus comparator implementations. By not needing, and thus not including, additional pre-amp stages besides pre-amp stage 220 and not including voltage level shifting stages between the pre-amp stage and the comparator, the overall propagation time through CAN bus comparator 200 is smaller than is the case with at least some prior CAN bus comparator implementations. One or more of these improvements results in an overall reduction in propagation delay and duty cycle distortion for the CAN receiver from the CAN pins to the RxD output.

The term "couple" is used throughout the specification. The term may cover connections, communications, or signal paths that enable a functional relationship consistent with the description of the present disclosure. For example, if device A generates a signal to control device B to perform an action, in a first example device A is coupled to device B, or in a second example device A is coupled to device B through intervening component C if intervening component C does not substantially alter the functional relationship between device A and device B such that device B is controlled by device A via the control signal generated by device A.

Modifications are possible in the described embodiments, and other embodiments are possible, within the scope of the claims.

What is claimed is:

1. A circuit, comprising:
a pre-amplifier stage having first and second outputs;
a comparator having first and second inputs, the first input coupled to the first output of the pre-amplifier stage, and the second input coupled to the second output of the pre-amplifier stage, the comparator including:
an input differential transistor pair;
a second pair of transistors coupled to the input differential transistor pair in a cascode configuration; and
a push-pull output stage coupled to the second pair of transistors;
a first current mirror coupled to a first transistor of the second pair of transistors; and
a second current mirror coupled to a second transistor of the second pair of transistors;
wherein:
the push-pull output stage includes a third transistor coupled to a fourth transistor in a current mirror configuration, the fourth transistor coupled to the first current mirror; and
the second current mirror includes a fifth transistor coupled to a sixth transistor, the fifth transistor is coupled to the second transistor of the second pair of transistors, and the sixth transistor is coupled to the third transistor at an output node of the comparator.

2. A circuit, comprising:
a pre-amplifier stage having first and second outputs;
a comparator having first and second inputs, the first input coupled to the first output of the pre-amplifier stage, and the second input coupled to the second output of the pre-amplifier stage, the comparator including:
an input differential transistor pair;
a second pair of transistors coupled to the input differential transistor pair in a cascode configuration; and
a push-pull output stage coupled to the second pair of transistors;
wherein the pre-amplifier stage is coupled to a first supply voltage node, and the push-pull output stage is coupled to a second supply voltage node, and wherein the second supply voltage node is configured to have a different supply voltage than the first supply voltage node.

3. A circuit, comprising:
a pre-amplifier stage having first and second outputs;
a comparator having first and second inputs, the first input coupled to the first output of the pre-amplifier stage, and the second input coupled to the second output of the pre-amplifier stage, the comparator including:
an input differential transistor pair;
a second pair of transistors coupled to the input differential transistor pair in a cascode configuration; and
a push-pull output stage coupled to the second pair of transistors;
wherein:
the input differential transistor pair includes first and second metal oxide field effect transistors (MOSFETs), the first MOSFET of the input differential transistor pair has a gate, a drain, and a source, and the second MOSFET of the input differential transistor pair has a gate, a drain, and a source;
the second pair of transistors includes first and second MOSFETs, the first MOSFET of the second pair of transistors has a gate, a drain, and a source, and the second MOSFET of the second pair of transistors has a gate, a drain, and a source;
the gates of the first and second MOSFETs of the second pair of transistors are coupled together and to a bias voltage node;
the drain of the first MOSFET of the input differential transistor pair is coupled to the source of the first MOSFET of the second pair of transistors; and
the drain of the second MOSFET of the input differential transistor pair is coupled to the source of the second MOSFET of the second pair of transistors;
further including a current source device coupled between the sources of the first and second MOSFETs of the input differential transistor pair and a ground node.

4. A circuit, comprising:
an input differential transistor pair comprising first and second inputs;
a second pair of transistors coupled to the input differential transistor pair in a cascode configuration;
a push-pull output stage coupled to the second pair of transistors;
a first current mirror coupled to a first transistor of the second pair of transistors; and
a second current mirror coupled to a second transistor of the second pair of transistors;
wherein:
the push-pull output stage includes a third transistor coupled to a fourth transistor in a current mirror configuration, the fourth transistor coupled to the first current mirror.

5. The circuit of claim 4, wherein
the second current mirror includes a fifth transistor coupled to a sixth transistor, the fifth transistor is coupled to the second transistor of the second pair of transistors, and the sixth transistor is coupled to the third transistor at an output node of the comparator.

6. A circuit, comprising:
an input differential transistor pair comprising first and second inputs;
a second pair of transistors coupled to the input differential transistor pair in a cascode configuration;
a push-pull output stage coupled to the second pair of transistors; and
a pre-amplifier stage having first and second outputs, and wherein the first output of the pre-amplifier stage is coupled to the first input of the input differential transistor pair, and the second output of the pre-amplifier stage is coupled to the second input of the input differential transistor pair;
wherein:
the pre-amplifier stage is coupled to a first supply voltage node;
the push-pull output stage is coupled to a second supply voltage node; and
the second supply voltage node is configured to have a different supply voltage than the first supply voltage node.

7. A circuit, comprising:
a pre-amplifier stage having first and second outputs;
a comparator having first and second inputs, the first input coupled to the first output of the pre-amplifier stage, and the second input coupled to the second output of the pre-amplifier stage, the comparator including:
an input differential transistor pair;
a second pair of transistors coupled to the input differential transistor pair in a cascode configuration; and
a push-pull output stage coupled to the second pair of transistors;
wherein the input differential transistor pair includes first and second metal oxide field effect transistors (MOSFETs), the first MOSFET of the input differential transistor pair has a gate, a drain, and a source, and the second MOSFET of the input differential transistor pair has a gate, a drain, and a source;
the second pair of transistors includes first and second MOSFETs, the first MOSFET of the second pair of transistors has a gate, a drain, and a source, and the second MOSFET of the second pair of transistors has a gate, a drain, and a source;
the gates of the first and second MOSFETs of the second pair of transistors are coupled together and to a bias voltage node;
the drain of the first MOSFET of the input differential transistor pair is coupled to the source of the first MOSFET of the second pair of transistors; and the drain of the second MOSFET of the input differential transistor pair is coupled to the source of the second MOSFET of the second pair of transistors;
further including a current source device coupled between the sources of the first and second MOSFETs of the input differential transistor pair and a ground node.

8. A controller area network (CAN) bus receiver, comprising:
a voltage divider providing a first CAN bus input and a second CAN bus input and having first and second outputs;
a pre-amplifier stage having first and second inputs and first and second outputs, the first output of the voltage divider coupled to the first input of the pre-amplifier stage, the second output of the voltage divider coupled to the second input of the pre-amplifier stage, and the pre-amplifier stage coupled to a first supply voltage node;
a comparator having first and second inputs, the first input coupled to the first output of the pre-amplifier stage, and the second input coupled to the second output of the pre-amplifier stage, the comparator including:
an input differential transistor pair providing the comparator's first and second inputs;
a second pair of transistors coupled to the input differential transistor pair in a cascode configuration; and
a push-pull output stage coupled to the second pair of transistors, the push-pull output stage coupled to a second supply voltage node.

9. The of claim 8, wherein the second supply voltage node is configured to have a different supply voltage than the first supply voltage node.

10. The CAN bus receiver of claim 8, further comprising:
a first current mirror coupled to a first transistor of the second pair of transistors; and
a second current mirror coupled to a second transistor of the second pair of transistors.

11. The CAN bus receiver of claim 10, wherein:
the push-pull output stage includes a third transistor coupled to a fourth transistor in a current mirror configuration, the fourth transistor coupled to the first current mirror; and
the second current mirror includes a fifth transistor coupled to a sixth transistor, the fifth transistor is coupled to the second transistor of the second pair of transistors, and the sixth transistor is coupled to the third transistor at an output node of the comparator.

* * * * *